United States Patent
Hirota et al.

(10) Patent No.: US 7,470,471 B2
(45) Date of Patent: Dec. 30, 2008

(54) RESIN COMPOSITION, PREPREG AND LAMINATE USING THE COMPOSITION

(75) Inventors: Kousuke Hirota, Sodegaura (JP); Koutarou Asahina, Sodegaura (JP); Kenji Shima, Sodegaura (JP); Hitoshi Sakuraba, Sodegaura (JP); Takashi Iiyama, Sodegaura (JP)

(73) Assignee: Mitsui Chemicals, Inc., Tokyo (JP)

( * ) Notice: Subject to any disclaimer, the term of this patent is extended or adjusted under 35 U.S.C. 154(b) by 343 days.

(21) Appl. No.: 10/978,379

(22) Filed: Nov. 2, 2004

(65) Prior Publication Data

US 2005/0100738 A1      May 12, 2005

(30) Foreign Application Priority Data

Nov. 12, 2003    (JP)    ............... 2003-382106

(51) Int. Cl.
*B32B 27/04*      (2006.01)

(52) U.S. Cl. .................................. 428/473.5

(58) Field of Classification Search ............. 428/473.5; 524/451

See application file for complete search history.

(56) References Cited

U.S. PATENT DOCUMENTS

| | | | | |
|---|---|---|---|---|
| 4,528,303 A | * | 7/1985 | Segaud | ........................ 523/212 |
| 5,338,567 A | * | 8/1994 | Kohm | ........................ 427/97.1 |

FOREIGN PATENT DOCUMENTS

| | | |
|---|---|---|
| JP | 3-247620 A | 11/1991 |
| JP | 7-206949 A | 8/1995 |
| JP | 07-316410 A | 12/1995 |
| JP | 7-316411 A | 12/1995 |
| JP | 08-216335 A | 8/1996 |
| JP | 2000-117733 A | 4/2000 |
| JP | 2001-329080 A | 11/2001 |
| JP | 2003-020407 A | 1/2003 |

\* cited by examiner

*Primary Examiner*—Thao T. Tran
(74) *Attorney, Agent, or Firm*—Buchanan Ingersol & Rooney PC

(57) ABSTRACT

The present invention is to provide a resin composition having sufficient rigidity and superior in the workability as well even if the thickness is as thin as 0.2 mm or less, and a prepreg and a laminate obtained from the resin composition. The resin composition comprises resin component containing a (A) compound having a maleimide group and (B) calcinated talc, wherein the calcinated talc is contained not less than 30 weight parts and not more than 250 weight parts to 100 weight parts of the total amount of the resin component containing a (A) compound having a maleimide group.

8 Claims, No Drawings

RESIN COMPOSITION, PREPREG AND LAMINATE USING THE COMPOSITION

TECHNICAL FIELD

The present invention relates to a resin composition used in the field of electronic materials such as electronic and electric parts, printed wiring boards, semiconductor substrates, IC sealing materials and the like, and use thereof. More specifically, the invention particularly relates to a resin composition which is suitable for "light weight," "thin" and "downsizing" to be used in printed wiring boards and semiconductor substrates, and which the elastic modulus and strength are high, and the workability is good, and a prepreg and a laminate using the same.

BACKGROUND ART

Accompanied with recent electronic equipments to be "light weight", "thin" and "downsizing", a thickness of a laminate used for a thin package and thin substrate such as circuit substrates including, for example, memory cards, portable telephones and the like which require space saving needs to be 0.5 mm or less, and preferably 0.2 mm or less. As the thickness of a laminate gets thinner and thinner, there occur more problems in that warpage or bending easily occurs in the process such as a circuit formation and the like or in the general course of carrying. These problems are caused by the fact that the rigidity of a substrate, in this case, the rigidity of a substrate at room temperature, is not sufficient as a substrate and laminates become thin.

Meanwhile, when a thin substrate was used as described above, and even when the thin substrate was exposed at high temperature in a semiconductor mounting process using ACP, ACF and the like requiring a high temperature or in a second mounting process using reflow soldering and the like, there have been problems of the mounting defect and the like such that the substrate warpage or the substrate bending occur, due to the result of the stress caused by the different thermal expansion coefficients. This resulted from the fact that the rigidity of a laminate at high temperature was not sufficient, relative to the stress caused by the high temperature.

In order to solve the above problems such as warpage during carrying while in a process, defect upon mounting and the like, it has been required for substrate materials to have high rigidity both at the room temperature and at high temperatures.

To achieve high rigidity, there have been proposed general methods including a method for making a glass fiber cloth in use to a glass having high hardness (S glass, H glass and the like), a method for increasing the folding number of the glass fiber cloth in use, and the like (refer to JP2001-329080A). However, there were drawbacks in that the glasses having high hardness were expensive as compared to glass fiber cloths in general (E glass), and that the workability including drilling and the like was inferior. Meanwhile, when the folding number was increased, there were problems in that the number of prepregs to use was increased per one sheet of a laminate so that the cost became higher, or the like.

On the other hand, there has also been reviewed such a method for increasing the rigidity by combining an inorganic filler into a resin composition. In particular, there has been known a method for increasing the rigidity of a resin composition by comprising high volume fraction of inorganic filler (refer to JP96-216335A). However, as the volume fraction of the inorganic filler was increased, there might easily occur problems in that detachment takes place at the surface of a resin and filler during processing, and the adhesive strength between prepregs in the laminate was deteriorated for easily causing peeling off.

Furthermore, when an inorganic filler having high rigidity such as silica was used, there have occurred problems in that abrasion of drill was remarkable during drill processing, hole positioning accuracy was deteriorated, hole wall coarseness was getting worse, and the like. When an inorganic filler having high rigidity such as silica or the like was used, a filler having a specific diameter was mixed (refer to JP2003-020407A) or a filler having low hardness was used together (refer to JP2000-117733A) in order to solve the problems. However, the effect was not sufficient.

DISCLOSURE OF THE INVENTION

An object of the present invention is to provide a resin composition having high rigidity and a laminate having sufficient rigidity even when the laminate is 0.2 mm or less using the resin composition, and superior in the workability such as drilling and the like.

As a result of an extensive review in order to accomplish the aforementioned object, the present applicant has found that, when a resin composition used for a laminate comprised resin component containing a (A) compound having a maleimide group and (B) calcinated talc in a specific amount, a resin composition having high elastic modulus both at room temperature and high temperature could be obtained because particles of inorganic compound having high rigidity were filled in a resin matrix having high heat resistance so as to be folded one another.

Namely, the present invention relates to:

(1) a resin composition comprising resin component containing a (A) compound having a maleimide group and (B) calcinated talc, wherein the calcinated talc is contained not less than 30 weight parts and not more than 250 weight parts to 100 weight parts of the total amount of the resin component containing a (A) compound having a maleimide group preferably (2) the resin composition as described in (1), wherein the (A) compound having a maleimide group is contained not less than 5 weight % and not more than 70 weight % to the total weight of the resin composition; more preferably (3) the resin composition as described in (1), wherein the (A) compound having a maleimide group contains 2 or more maleimide groups; further preferably (4) the resin composition as described in (1), further comprising an epoxy resin;

(5) the resin composition as described in (1), further comprising a phenolic resin;

(6) the resin composition as described in (5), wherein the phenolic resin comprises at least one naphthalene ring;

(7) the resin composition as described in (4), wherein the epoxy resin is contained not less than 10 weight % and not more than 50 weight % to the total weight of the resin composition;

(8) the resin composition as described in (5), wherein the phenolic resin is contained not less than 10 weight % and not more than 50 weight % to the total weight of the resin composition; furthermore, (9) a prepreg obtained by impregnating a substrate with the resin composition as described in (1);

(10) a laminate wherein a sheet or plenty of sheets of the prepregs as described in (9) are laminated and heat-cured; and

(11) a laminate comprising the resin obtained from the resin composition as described in (1) as an insulating layer.

EFFECT OF THE INVENTION

Because the resin composition of the present invention has high rigidity, sufficiently high elastic modulus can be obtained both at room temperature and at high temperature even when a thin laminate having 0.2 mm or less is used. Meanwhile, the workability such as drilling and the like is excellent even if the elastic modulus of a resin composition is high.

BEST MODE FOR CARRYING OUT THE INVENTION

The present invention will be described in more detail below.

The resin composition comprises resin component containing a (A) compound having a maleimide group and (B) calcinated talc, wherein the calcinated talc is contained not less than 30 weight parts and not more than 250 weight parts to 100 weight parts of the total amount of the resin component containing a (A) compound having a maleimide group. First, each component of the resin composition used in the present invention is described below.

(A) Compound Having a Maleimide Group (A) compound having a maleimide group to be used in the present invention is not particularly restricted if it contains a maleimide group. However, it is preferable that a compound has two or more maleimide groups as represented by the following formula (1):

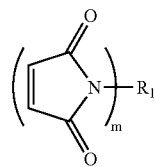
(1)

wherein $R_1$ represents an m-valent organic group and m is preferably an integer of 2 to 10. As an organic group expressed by $R_1$, preferable examples include those that are selected from a group of the following formulae (2-1) to (2-3):

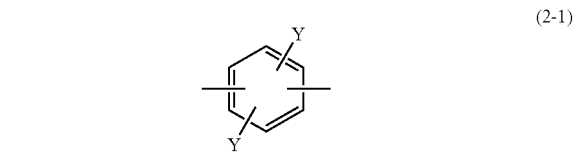
(2-1)

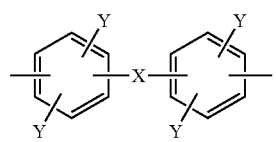
(2-2)

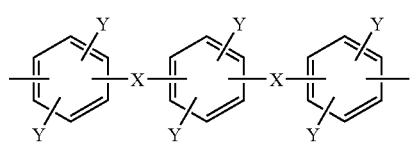
(2-3)

wherein X may be the same or different with one another and represents —$CH_2$—, —$C(CH_3)_2$—, —$C(C_2H_5)_2$—, —CO—, —O—, —(single bond), —S— or —$SO_2$—. Y may be the same or different with one another and represents —$CH_3$, —$CH_2CH_3$ or a hydrogen atom.

As a compound having at least two or more maleimide groups to be used in the present invention, there can be specifically mentioned, for example, N,N'-(1,3-phenylene)bismaleimide, N,N'-[1,3-(2-methylphenylene)]bismaleimide, N,N'-(1,4-phenylene)bismaleimide, bis(4-maleimidophenyl)methane, bis(3-methyl-4-maleimidophenyl)methane, bis(4-maleimidophenyl)ether, bis(4-maleimidophenyl)sulfone, bis(4-maleimidophenyl)sulfide, bis(4-maleimidophenyl)ketone, 1,4-bis(maleimidomethyl)benzene, 1,3-bis(3-maleimidophenoxy)benzene, bis[4-(4-maleimidophenoxy)phenyl]methane, 1,1-bis[4-(3-maleimidophenoxy)phenyl]ethane, 1,1-bis[4-(4-maleimidophenoxy)phenyl]ethane, 1,2-bis[4-(3-maleimidophenoxy)phenyl]ethane, 1,2-bis[4-(4-maleimidophenoxy)phenyl]ethane and the like.

Furthermore, as a compound having at least two or more maleimide groups to be used in the present invention, there can be mentioned a compound having maleimide groups represented by the following formula (3), represented by the following formula (4) or the like:

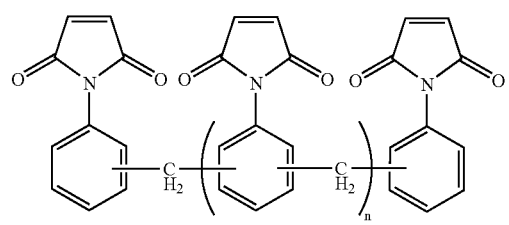
(3)

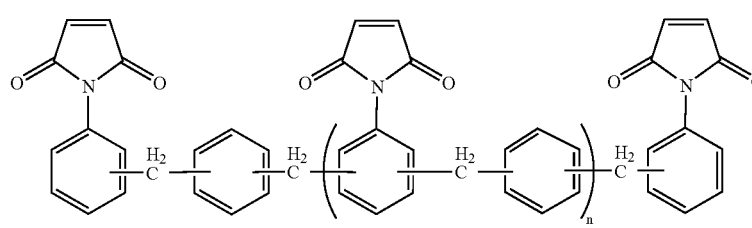
(4)

wherein n is 0 to 10 in average. These (A) compounds having at least two or more maleimide groups can be used singly or in combination of 2 or more kinds.

(B) Calcinated Talc

As (B) calcinated talc to be used in the present invention, those made by calcinating talc existing as a natural mineral or industrially produced ones can be used. As talc ($3MgO.4SiO_2.H_2O$) contains crystal water, crystal water is released from talc by being calcinated under high temperature of around 700° C. or more. For example, crystal water can be released by being calcinated at a temperature of 1000° C. to 1500° C. for about 5 to 20 hours. As talc to be used in the present invention, for example, talc that released crystal water as described above may be used. For example, talc that is called calcinated talc is used. When talc obtained as a mineral are calcinated, oxides such as aluminium oxide, calcium oxide, potassium oxide, iron oxide and the like in a small amount may be contained in the talc, but such ingredients cause no problems in particular.

It is important that the content of (B) calcinated talc is not less than 30 weight parts and not more than 250 weight parts, and preferably not less than 50 weight parts and not more than 150 weight parts to 100 weight parts of the total amount of the resin component ((A) component and other resin components). When the amount added is not less than 30 weight parts, the effect of addition can be expected. When the amount added is not more than 250 weight parts, the viscosity of a resin varnish is good and the impregnating property is good. The amount added may partly depend on the type of a compound to be added. However, as far as the amount is within the above range, the elastic modulus of a resin-cured product is improved. When the resin-cured product is prepared as a laminate, the flexural modulus of the laminate becomes 20 GPa or more which is a desirable value.

Calcinated talc has higher hardness as a crystal than that of uncalcinated talc. For this reason, when comparing a case where calcinated talc is contained in a resin composition comprising a compound having a maleimide group to a case where uncalcinated talc is contained in a resin composition comprising a compound having a maleimide group, the one with talc being calcinated is found to have the effect of conspicuously enhancing the elastic modulus.

Furthermore, as (B) calcinated talc is an inorganic compound having a layered structure, its particle is in the shape of a plate and the aspect ratio (the ratio between the lengthwise length and crosswise length of the particle) is high. When a resin composition that is filled with the plate-shape particles is used as a prepreg, in its impregnating coat process, particles are easily folded one another and filled in a resin. So, when the prepreg is to be a cured product, it is considered that the elastic modulus relative to the stress in the flexural direction is improved. The diameter of these inorganic fillers has an average diameter D 50 preferably in a range of not less than 0.1 μm and not more than 10.0 μm. The diameter of not less than 0.1 μm is rather preferred as uniform dispersion is easily made without causing any secondary cohesion for handling. Also, D50 of not more than 10.0 μm is preferred for a resin varnish as it is difficult to cause precipitation or the like, and stability becomes good.

It is preferable for (B) calcinated talc to be used in the present invention to conduct surface treatment using a coupling agent. The type of the coupling agent necessary for surface treatment is not particularly restricted. As a coupling agent, there can be mentioned, for example, a silane coupling agent, a titanate coupling agent and the like. In particular, a silane coupling agent is preferred. As a silane coupling agent, there can be mentioned, for example, vinyltrimethoxy silane, vinyl trimethoxy silane, N-(2-aminoethyl)-3-aminopropylmethyldimethoxy silane, N-(2-aminoethyl)-3-aminopropyltrimethoxy silane, N-phenyl-γ-aminopropyltrimethoxy silane, 3-aminopropyltriethoxy silane, 3-anilinopropyltrimethoxy silane, 3-glycidoxypropyltrimethoxy silane, 3-glycidoxypropylmethyldimethoxy silane, 2-(3,4-epoxycyclohexyl)ethyltrimethoxy silane, 3-methacryloxypropyltrimethoxy silane, 3-mercaptopropyltrimethoxy silane and the like. One or tow or more kinds of these agents are used. The silane coupling agents that are fixed on the surface of (B) calcinated talc in advance by absorption or a reaction are preferred.

Epoxy Resin

It is preferable for the resin composition of the present invention to further contain an epoxy resin. An epoxy resin, which can be used, is not particularly restricted. However, an epoxy resin having at least two or more glycidyl groups in a molecule is preferred. As an epoxy resin, there can be mentioned, for example, bisphenol A type epoxy resin, bisphenol F type epoxy resin, novolak type epoxy resin, cresol novolak type epoxy resin, bisphenol A novolak type epoxy resin, bisphenol F novolak type epoxy resin and the like. Or dicyclopentadiene type epoxy resin and the like represented by the following formula (5) can also be mentioned:

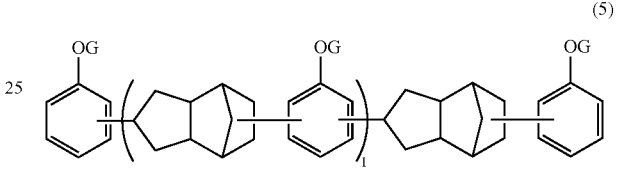

(5)

wherein G is a glycidyl group and l is 0 to 6 in average.

Furthermore, there can be also mentioned an epoxy resin that is glycidyl-etherified by reacting epichlorohydrin with a compound having two or more phenolic hydroxyl groups such as dihydroxynaphthalene, phenolic aralkyl resin, naphthol aralkyl resin, phenolic aralkyl resin having a naphthalene ring, novolak resin having a naphthalene skeleton and the like; or an epoxy resin having a naphthalene ring represented by the following formula (6):

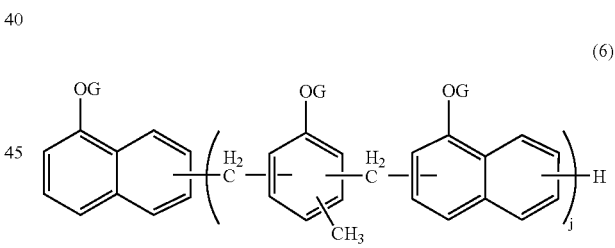

(6)

wherein G is a glycidyl group and j is 0 to 10 in average.

Among the aforementioned epoxy resins, an epoxy resin having a naphthalene ring is preferred. An epoxy resin having a naphthalene ring represented by the following formula (7) and (8) is more preferred:

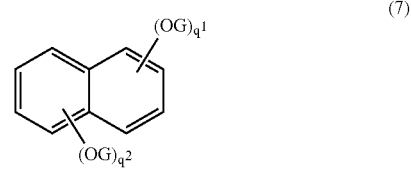

(7)

wherein G is a glycidyl group, $q_1$ and $q_2$ are each an integer of 1 or more, and $q_1+q_2 \leqq 8$:

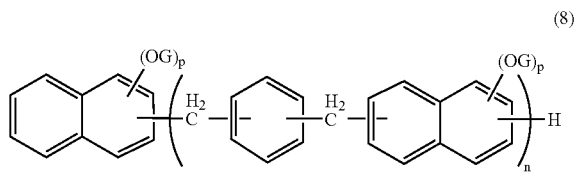

(8)

wherein G is a glycidyl group, p is 1 or 2 and n is an integer of 1 to 10.

Incidentally, these epoxy resins can be used singly or in combination of 2 or more kinds.

Phenolic Resin

It is preferable for the resin composition of the present invention to further contain a phenolic resin. A phenolic resin, which can be used, is a compound having at least one phenolic hydroxyl group. As far as this condition is satisfied, a phenolic resin is not particularly restricted. It is preferable that such a resin contains at least one naphthalene ring. Specifically, there can be mentioned, for example, hydroxynaphthalenes such as naphthol, dihydroxynaphthalene, trihydroxynaphthalene, tetrahydroxynaphthalene and the like; a compound obtained by reacting hydroxynaphthalenes with aldehydes; and a compound obtained by reacting a mixture of the hydroxynaphthalenes and phenols with aldehydes. Specific examples of these compounds include a compound represented by the formula (9) and the like. Incidentally, as examples of phenols, there can be mentioned, for example, phenol, cresol, resorcinol and the like. As aldehydes, there can be mentioned, for example, formaldehyde, acetaldehyde, benzaldehyde and the like.

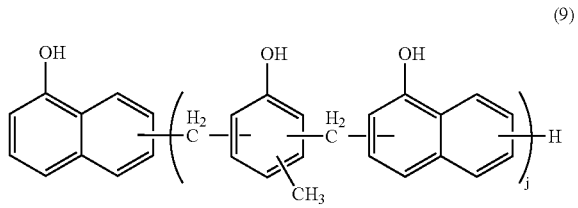

(9)

wherein j is 0 to 10 in average.

Incidentally, these compounds can be obtained by the aforementioned method. However, a commercial product such as KAYAHARD NHN manufactured by Nippon Kayaku Co., Ltd. can also be used.

Or there can be mentioned, for example, hydroxy naphthalenes and compounds obtained by reacting a mixture of these hydroxy naphthalenes and phenols with an aralkyl alcohol derivative or aralkyl halide derivative. Specific examples of these compounds include a compound represented by the formula (10) and the like. Incidentally, as phenols, there can be mentioned, for example, phenol, cresol, resorcinol and the like. As aralkyl alcohol derivatives, there can be mentioned, for example, p-xylylene glycol, p-xylylene glycol dimethyl ether and the like. Also, as aralkyl halide derivatives, there can be mentioned, for example, p-xylylene dichloride and the like.

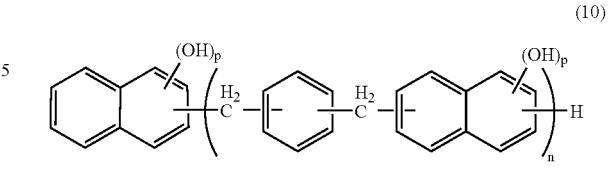

(10)

wherein p is 1 or 2, and n is an integer of 1 to 10.

Incidentally, these compounds can be obtained by the aforementioned method. However, a commercial product such as SN180 manufactured by Nippon Steel Chemical Co., Ltd. can also be used. These compounds having a phenolic hydroxyl group can be used singly or in combination of 2 or more kinds.

Resin Composition

In the resin composition of the present invention, the content of the (A) compound having a maleimide group is preferably not less than 5 weight % and not more than 70 weight % and more preferably not less than 30 weight % and not more than 60 weight % to the total amount of the resin component ((A)+other resin components). When the content of (A) compound having a maleimide group is 5 weight % or more, and preferably 30 weight % or more, the rigidity of the composition is high and high elastic modulus at high temperature can be expected. Meanwhile, the content of not more than 70 weight % is rather preferred because hygroscopicity of the resin composition is low, and heat resistance under hygroscopic condition such as solder heat resistance test and the like is sufficient.

Furthermore, the content of an epoxy resin, when an epoxy resin is contained in the resin composition, is preferably not less than 10 weight % and not more than 50 weight % to the total weight of the resin component. The content of not less than 10 weight % is rather preferred as brittleness of a resin is low, while the content of not more than 50 weight % is rather practical as thermosetting speed of a resin is rapid and it takes shorter time required for the completion of curing.

Furthermore, the content of a phenolic resin, when a phenolic resin is contained in the resin composition, is preferably not less than 10 weight % and not more than 50 weight % to the total weight of the resin component. The content of not less than 10 weight % is rather preferred as brittleness of a resin is low, while the content of not more than 50 weight % is rather practical because thermosetting speed of a resin is rapid and it takes shorter time required for the completion of curing.

Other Resin Components

Other resin components can be added into the resin composition of the present invention as desired in addition to the aforementioned components. As desirable examples, there can be mentioned a thermoplastic resin, a reactive diluent and the like. These may be combined within the range of not damaging the object of the present invention.

A thermoplastic resin is not particularly restricted. However, as desirable examples, there can be mentioned polyether sulfone, polysulfone, polyphenylene sulfide, polyetherether ketone, polyimide, polyetherimide, polyamideimide, aromatic polyamide, polyprabanic acid, polyphenylene ether, phenoxy resin, further liquid crystal polymer such as aromatic polyester and the like having the molecular weight of 5000 to 100000. Furthermore, the thermoplastic resin grafted with carboxyl group, hydroxyl group, alkene group and the like on the end or chain side can be more properly used. When the molecular weight of the themoplastic resins is not less than 5000, there is the effect of granting flexiblility. When the molecular weight is not more than 100000, the viscosity does not become excessively high so that moldability becomes sufficient. Therefore, the molecular weight of the thermoplastic resins is preferably not more than 5000 and not less than 100000.

The content of the thermoplastic resin is preferably 0.1 to 30 weight % to the resin component of the aforementioned resin composition. If the content of not less than 0.1 weight %, the effect of addition can be obtained. If the content is not more than 30 weight %, heat resistance of the resin composition can be maintained.

As a reactive diluent, there can be mentioned, for example, a reactive diluent to be generally used for epoxy resins such as glycidol, allyl glycidyl ether, methyl glycidyl ether, butyl glycidyl ether, phenyl glycidyl ether and the like; and a compound having an allyl group such as diallylphthalate, o,o'-diallyl bisphenol A, bisphenol A diallylether (these are reactive diluents to be generally used for thermosetting imide resin). The content of these reactive diluents is preferably 0.1 to 10 weight % to the resin component. The content of 0.1 weight % or more rather results in bringing sufficient effect as a reactive diluent and the content of 10 weight % or less results in bringing good workability without excessively reducing the viscosity of a resin varnish comprising a resin composition.

Flame Retardant

The resin composition of the present invention may further contain a flame retardant. As a flame retardant, which can be used for the resin composition of the present invention, there can be mentioned known flame retardants such as bromine-containing flame retardant, phosphorous-containing flame retardant, metal hydroxide and the like.

Examples of bromine-containing flame retardants are not particularly restricted. However, as desirable examples, there can be mentioned tetrabromobisphenol A, an epoxy resin obtained by reacting tetrabromobisphenol A with epichlorohydrin and oligomer of tetrabromobisphenol A, polymer of tetrabromobisphenol A, and the like. Meanwhile, bromine-containing maleimide compounds such as bromine substituted phenylmaleimide and the like can also be used. These bromine-containing flame retardants can be used singly or in combination of 2 or more kinds.

The content of bromine-containing flame retardant is preferably 3 to 7 weight % to the total weight of the resin component in terms of an bromine element. This range is preferable because flame retardancy can be obtained and heat resistance of the resin composition can be maintained.

As a phosphorous-containing flame retardant, there can be mentioned, for example, aromatic condensed phosphoric acid esters that are condensed using phosphoric acid esters such as triphenyl phosphate, trixylenyl phosphate, cresyldiphenyl phosphate, xylenyidiphenyl phosphate, tris(isopropylphenyl) phosphate and the like. These phosphorous-containing flame retardants can be used singly or in combination of 2 or more kinds.

The amount of a phosphorous-containing flame retardant is preferably 0.3 to 3 weight % to the total weight of the resin component in terms of phosphorous element. This range is preferable because flame retardancy can be obtained and moisture resistance of the resin composition can be maintained.

As metal hydroxides, metallic compounds having $(OH)_n$ such as aluminium hydroxide, magnesium hydroxide, zinc hydroxystannate and the like are preferred. Any compounds as described above are not particularly restricted. However, aluminum hydroxide ($Al(OH)_3$), magnesium hydroxide (Mg $(OH)_2$), zinc hydroxystannate ($ZnSn(OH)_6$) are more preferred. Aluminium hydroxide is further preferred. It is preferable for the metal hydroxides that the content of $Na_2O$ to be included as impurities is low. The content of $Na_2O$ is preferably not more than 0.3%, more preferably 0.2% or less, and further preferably 0.1% or less. When the amount of $Na_2O$ to be included in the metal hydroxide as impurities is high, it is preferable to use metal hydroxides after the amount of $Na_2O$ to be included is reduced down to less than 0.3% according to a method for washing or a method as disclosed in JP96-325011A and the like. If the content of $Na_2O$ of metal hydroxide is within the above range, a laminate which is obtained from the heat resistant resin composition containing the metal hydroxide is superior in solder heat resistance. Also, when the laminate is used as a circuit substrate, it hardly causes deterioration of reliability due to ion migration. When metal hydroxide is used for the resin composition of the present invention, the diameter of metal hydroxide is not particularly restricted. However, the average diameter of around 0.1 to 10 μm is usually used. The metal hydroxides can be used singly or in combination of 2 or more kinds.

Also, it is preferable to employ a coupling agent in the aforementioned metal hydroxides. Coupling agents such as silane coupling agent, titanate coupling agent, aluminate coupling agent, zirco-aluminate coupling agent and the like can be used. Among them, a silane coupling agent is preferred and especially a silane coupling agent having a reactive functional group is further preferred.

As a silane coupling agent, there can be mentioned, for example, vinyltrimethoxy silane, vinyltrimethoxy silane, N-(2-aminoethyl)-3-aminopropylmethyldimethoxy silane, N-(2-aminoethyl)-3-aminopropyltrimethoxy silane, N-phenyl-γ-aminopropyltrimethoxy silane, 3-aminopropyltriethoxy silane, 3-anilinopropyltrimethoxy silane, 3-glycidoxypropyltrimethoxy silane, 3-glycidoxypropylmethyldimethoxy silane, 2-(3,4-epoxycyclohexyl)ethyltrimethoxy silane, 3-methacryloxypropyltrimethoxy silane, 3-mercaptopropyltrimethoxy silane and the like. One or 2 or more kinds thereof are used in combination. It is preferable that the silane coupling agents may be attached on the surface of metal hydroxide in advance by absorption or a reaction. If a coupling agent is used, the adhesiveness between a metal hydroxide and a resin is increased so that improvement of the mechanical strength and heat resistance of a laminate obtained from the resin composition can be expected.

Metal hydroxides are contained preferably 5 to 100 weight parts and more preferably 5 to 80 weight parts to 100 weight parts of the total amount of the resin component. When the content of metal hydroxide is in the above range, the impregnating property to a substrate having proper viscosity of a varnish, which can obtain the effect of flame retardation, is good and the workability is superior. Or the content of metal hydroxide of not more than 100 weight parts (not more than 50 weight % of the resin composition) is preferred because there is not much possibility to have a bad influence upon solder heat resistance and the like after hygroscopicity without increasing water absorption of the resin composition.

Curing Accelerator

It is preferable for the resin composition of the present invention to contain a curing accelerator. As a curing accelerator, there can be mentioned, for example, imidazols such as 2-methyimidazol, 2-ethyl-4-methylimidazol, 2-heptadecylimidazol, 2-ethyl4-methylimidazoltetraphenylborate and the like; amines such as triethanolamine, triethylenediamine, N-methylmorpholine and the like; tetraphenylboron salts such as tetraphenylphosphonium tetraphenylborate, triethylammonium tetraphenylboate and the like; 1,8-diaza-biscyclo(5,4,0)undecene-7 and derivatives thereof. The curing accelerators can be used singly or in combination of 2 or more kinds.

The content of a curing accelerator may preferably be compounded such that time required for desired gelation of a varnish or prepreg to be described later can be secured. However, in general, the content is 0.005 to 10 weight parts to 100 weight parts of the total amount of the resin component.

Additive

An additive can be added to the resin composition of the present invention according to use. Desirable examples of an additive include additives, which are generally used as an antifoaming agent, a leveling agent and a surface tension modifier. As an additive, there can be specifically mentioned, for example, an antifoaming agent such as a fluoride additive, silicon additive, acrylic additive and the like; and a leveling agent. The content of an additive is preferably 0.0005 to 10 weight parts to 100 weight parts of the total amount of the resin component in general.

Method for Manufacturing a Resin Composition

The resin composition of the present invention, for example, comprises a (A) compound having a maleimide group, an epoxy, resin and/or a phenolic resin and/or other resin components which are heated and mixed at 80° C. to 200° C. for 0.1 to 10 hours for a uniform mixture. The (B) calcinated talc can be mixed with the aforementioned mixture in a powder state that is ground at room temperature or can be combined with a resin varnish comprising resin component according to a method to be described below.

Resin Varnish

The resin varnish of the present invention contains a (A) compound having a maleimide group, (B) calcinated talc, an epoxy resin, and/or a phenolic resin, and/or other resin components which are dissolved in a solvent.

As a solvent used for the resin varnish, there can be mentioned, for example, ethyleneglycolmonoethylether, propyleneglycolmonomethylether, ethyleneglycolmonobutylether, N,N-dimethylformamide, N,N-dimethylacetoamide, dioxane, acetone, N-methyl-2-pyrrolidone, dimethylsulfoxide, methylethylketone, methylisobutylketone, cyclohexane, 2-heptanone and the like. It is preferable for a solvent to have a relatively low boiling point. Methylethylketone, acetone, dioxane or a mixture having main ingredients thereof can be preferably used.

The resin varnish of the present invention may contain the aforementioned compound having a maleimide group, (B) calcinated talc, an epoxy resin and/or a phenolic resin, and/or other resin components within the range of not damaging the object of the present invention. The content of the aforementioned compound having a maleimide group along with (B) calcinated talc, an epoxy resin and/or a phenolic resin, and/or other resin components in the resin varnish is the same as that of the aforementioned resin composition.

It is preferable for the resin varnish of the present invention to contain a curing accelerator as shown above and the content is the same as the above. Also, the resin varnish of the present invention can contain [other resin components] which may be contained in the aforementioned resin composition. The total weight of the aforementioned resin components in the resin varnish is usually 50 to 80 weight % and preferably 55 to 75 weight %.

The resin varnish can be obtained by dissolving the resin composition in an organic solvent, and can be controlled by heating and mixing a (A) compound having a maleimide with an epoxy resin and/or a phenolic resin, and/or other resin components in an organic solvent for a uniform solution. The temperature during heating and mixing depends on the boiling point of an organic solvent, but it is usually 50° C. to 200° C. The time required for heating and mixing is usually 0.1 to 20 hours.

Prepreg

In the prepreg of the present invention, the resin composition is impregnated on a substrate. The prepreg of the present invention can be produced by coating or impregnating the resin varnish on a substrate, and then drying for removing the solvent. As a substrate, all known substrates used for conventional prepregs such as glass nonwoven fabric, glass fiber cloth, carbon fiber cloth, organic fiber cloth, paper and the like can be used. The resin varnish is coated or impregnated on the substrate and then a prepreg is produced through a drying process. However, methods for coating, impregnating and drying are not particularly restricted as known methods have been used. Drying conditions are properly determined depending on the boiling point of a solvent in use. However, such a condition for the amount of the residual solvent in a prepreg of 1 weight % or less is preferred. As a specific example, the residence time is preferably about 5 to 10 minutes at a temperature range of 140° C. to 220° C. However, in a production process for drying a prepreg continuously, the temperature range is not restricted as the optimum temperature range varies depending on the carrying speed.

Laminate

A sheet or a plurality of sheets of the aforementioned prepreg are laminated and heat-cured by the hot press to produce the laminate of the present invention. The conditions of heat-pressurizing for producing a laminate are not particularly restricted. However, the heating temperature is preferably 100° C. to 300° C. and more preferably 150° C. to 250° C., the pressure is preferably 1.0 to 10 MPa, and the time required for heat-pressurizing is preferably about 10 to 300 minutes.

Also, the laminate of the present invention may have metal foils or metal plates that are laminated on both sides and integrated into a single body. In this case, the laminate can be produced by laminating metal foils or metal plates on one side or both sides of a sheet of the prepreg for heat-compressing or laminating metal foils or metal plates on both sides of the outermost layers of a plurality of sheets of the prepregs for heat-compressing, and by heat-curing of the prepreg and integrated into a single body. As a metal foil or a metal plate, copper, aluminum, iron, stainless and the like can be used. The conditions of heat-curing are the same as those of the aforementioned laminate.

Furthermore, the laminate of the present invention also includes a multi-layer laminate having the aforementioned resin composition as an insulating layer which is produced such that on both sides of the laminate, circuits are formed and prepregs are further laminated one another, and then metal foils or metal plates are laminated on the outermost sides for heat-pressurizing. The multi-layer laminate of the present invention can be produced by using various methods, which are used for a production process of a laminate for a multi-layer printed wiring board in general. Especially, a method is not particularly restricted.

EXAMPLES

The present invention is described specifically below by way of Examples. However, the present invention is not restricted to these Examples.

Examples 1 to 3 and Comparative Examples 1 to 2

Of compositions shown in Table 1, a mixture of a (A) compound having maleimide, an epoxy resin, a phenolic resin and other resins were dissolved in a mixed solvent of methylethylketone and N-methyl-2-pyrrolidone (the mixing ratio of methylethylketone to N-methyl-2-pyrrolidone was 4 to 1) in a flask at 80° C. for 6 hours, thus obtaining a resin varnish. (B) calcinated talc or other inorganic compound was added to the thus-obtained resin varnish. The resulting solution was uniformly stirred, which was coated at a thickness of about 20 µm on a release film, dried at 100° C. for 30 minutes, and then the release film was peeled off for grinding, thus obtaining powder of a resin composition. The powder of the resin composition was put into a 3 cm×6 cm frame and molded under the heating conditions of at 180° C. to 230° C. for 120 minutes under the pressure of 2 MPa. Next, these molded products were cut by 2.5 cm×5 cm using a diamond cutter, thus obtaining a resin plate having a thickness of about 2.0 mm. The flexural strength and elastic modulus of these resin plates were measured according to ASTM D790-00. Incidentally, the unit of each component in the Table was the weight part.

Examples 4 to 7 and Comparative Examples 3 to 4

Of compositions shown in Table 2, a mixture of a (A) compound having maleimide, an epoxy resin, a phenolic resin and other resins were dissolved in a mixed solvent of methylethylketone and N-methyl-2-pyrrolidone (the mixing ratio of methylethylketone to N-methyl-2-pyrrolidone was 4 to 1) in a flask at 80° C. for 6 hours, thus obtaining a resin varnish. (B) calcinated talc, other inorganic compound, a curing accelerator, a flame retardant or an additive was added to the thus-obtained resin varnish. The resulting solution was uniformly stirred, thus obtaining a uniform resin composition. These varnishes were impregnated in a glass fiber cloth of 108 g/m$^2$ (a thickness of about 100 µm) and dried at 150° C. for 5 minutes, thus obtaining a prepreg of about 200 g/m$^2$ (a thickness of about 100 µm). 16 sheets of the prepregs were folded one another. A copper foil was further arranged at the outermost layers thereof on the top and bottom, and molded under the heating conditions of at 180° C. to 230° C. for 120 minutes under the pressure of 2 MPa, thus obtaining a copper clad laminate having a thickness of 1.6 to 1.7 mm. The flexural test results of the thus-obtained laminate were shown in the Table in the same manner. The method of the test was indicated below. Also, an evaluation of the elastic modulus of a laminate having a thickness of 0.2 mm or less was prepared in the same manner as the above except that 2 sheets of the prepregs were folded one another. A copper clad laminate having a thickness of 0.2 to 0.3 mm was used for the test. Furthermore, to evaluate the workability, a copper clad laminate having a thickness of 0.4 to 0.5 mm that was produced by folding 4 sheets of the prepregs in the same manner was test-processed using a drilling machine having a diameter of 0.15 mm under the conditions of the following (3). The workability of the copper clad laminate was evaluated in terms of breakage rate of drill.

(1) Flexural Strength, Elastic Modulus: These were measured according to JIS C6481 5.8.

(2) Thin Plate Elastic Modulus: It was measured according to JIS C6481 5.17.2. The storage modulus at 50° C. and 200° C. was taken for the elastic modulus at room temperature and at high temperature respectively.

(3) Workability: Using a drill (NEVO.15×2.5E962S) manufactured by Union Tool Co., hole drilling was performed with the folding number of 3 sheets, rotation number of 160 Krpm and infeed speed of 1.2 m/min, and counted the number of broken drills out of 10 drills in use to obtain the breakage rate.

In Examples and Comparative Examples, the following raw materials were used.

(A) Compound Having a Maleimide Group:

BMI-S (product name, the content of a nitrogen atom: approximately 8%, molecular weight: 358, manufactured by Mitsui Chemicals, Inc.)

BMI-MP (product name, the content of a nitrogen atom: approximately 10%, molecular weight: 268, manufactured by Mitsui Chemicals, Inc.)

(B) Calcinated Talc and Other Inorganic Compound:

calcinated talc; BST (product name, average particle diameter: 5 µm, manufactured by Nippon Talc Co., Ltd.)

calcinated talc; SG95 calcinated product (average particle diameter: 3 µm, manufactured by Nippon Talc Co., Ltd.)

calcinated talc; SG2000 calcinated product (average particle diameter: 2 µm, manufactured by Nippon Talc Co., Ltd.)

talc; SG2000 (product name, average particle diameter: 2 µm, manufactured by Nippon Talc Co., Ltd.)

silica; SO-C5 (product name, average particle diameter: 1.7 µm, manufactured by Tatsumori Co., Ltd.)

Epoxy Resin:

bisphenol A type epoxy resin, Epikote 828EL (epoxy equivalent: 190, manufactured by Japan Epoxy Resins Co., Ltd.)

dicyclopentadiene type epoxy resin, Epicron HP7200 (epoxy equivalent: 250, manufactured by DaiNippon Ink and Chemicals, Inc.)

naphthalene type epoxy resin, Epicron HP4032 (product name, epoxy equivalent: 150, manufactured by DaiNippon Ink and Chemicals, Inc.)

naphthol aralkyl type epoxy resin, ESN175 (product name, epoxy equivalent: 270, manufactured by Nippon Steel Chemical Group)

Phenolic Resin:

naphthol aralkyl resin, SN180 (product name, OH equivalent: 190, manufactured by Nippon Steel Chemical Group)

naphthol aralkyl resin, SN485 (product name, OH equivalent: 215, manufactured by Nippon Steel Chemical Group)

Other Resin Compositions:

Reactive diluent: allyl glycidyl ether (Epiole A (product name), manufactured by NOF Corp.)

Flame Retardant:

Brominated bisphenol A type epoxy resin (Epikote 5050 (product name), manufactured by Japan Epoxy Resins Co., Ltd.)

Curing accelerator: 2-ethyl-4-methylimidazol (2E4MZ (product name), manufactured by Shikoku Corp.)

Additive: FTX218 (product name, manufactured by Neos Co., Ltd.)

TABLE 1

|  | Example 1 | Example 2 | Example 3 | Comparative Example 1 | Comparative Example 2 |
|---|---|---|---|---|---|
| (A) Maleimide | | | | | |
| BMI-S | 50 | 50 |  | 50 | 50 |
| BMI-MP |  |  | 50 |  |  |
| (B) Calcinated talc and other inorganic compounds | | | | | |
| BST | 100 |  |  |  |  |
| SG95 calcinated product |  | 100 |  |  |  |
| SG2000 calcinated product |  |  | 100 |  |  |
| Talc |  |  |  |  | 100 |
| Epoxy resin | | | | | |
| Epikote 828EL |  |  | 15 |  |  |
| Epicron HP7200 | 18 | 9 |  | 18 | 18 |
| Epicron HP4032 | 11 |  | 15 | 11 | 11 |
| ESN175 |  | 13 |  |  |  |
| Phenolic resin | | | | | |
| SN485 | 21 | 21 |  | 21 | 21 |
| SN180 |  |  | 20 |  |  |
| Flexural strength | 160 MPa | 150 MPa | 200 MPa | 130 MPa | 100 MPa |
| Flexural modulus | 8 GPa | 11 GPa | 10 GPa | 4 GPa | 5 GPa |

In comparison with Examples, Comparative Example 1 shows that both the flexural strength and elastic modulus were low as an inorganic compound was not added, while Comparative Example 2 shows that the flexural modulus was low as non-calcinated product was used.

TABLE 2

|  | Example 4 | Example 5 | Example 6 | Example 7 | Comparative Example 3 | Comparative Example 4 |
|---|---|---|---|---|---|---|
| (A) Maleimide | | | | | | |
| BMI-S | 45 | 45 |  | 50 | 50 | 50 |
| BMI-MP |  |  | 50 |  |  |  |
| (B) Calcinated talc and other inorganic compounds | | | | | | |
| BST | 100 |  |  | 150 |  |  |
| SG95 calcinated product |  | 50 |  |  |  |  |
| SG2000 calcinated product |  |  | 100 |  |  |  |
| Talc |  |  |  |  | 100 |  |
| Silica |  |  |  |  |  | 100 |
| Epoxy resin | | | | | | |
| Epikote 828EL |  | 6 | 11 | 38 |  |  |
| Epicron HP7200 | 13 | 7 |  |  | 13 | 13 |
| Epicron HP4032 | 11 |  | 10 |  | 11 | 11 |
| ESN175 |  | 11 |  |  |  |  |
| Phenolic resin | | | | | | |
| SN485 | 16 | 16 |  |  | 16 | 16 |
| SN180 |  |  | 14 | 12 |  |  |
| Flame retardant | 10 | 10 | 10 | 10 | 10 | 10 |
| Reactive diluent | 5 | 5 | 5 | 5 | 5 | 5 |
| Curing accelerator |  | 0.05 | 0.05 | 0.05 | 0.05 | 0.05 |
| Additive |  | 0.005 |  |  |  |  |
| Flexural strength | 400 MPa | 380 MPa | 450 MPa | 430 MPa | 300 MPa | 400 MPa |
| Flexural modulus | 23 GPa | 27 GPa | 25 GPa | 27 GPa | 18 GPa | 25 GPa |

TABLE 2-continued

|  | Example | | | | Comparative Example | |
| --- | --- | --- | --- | --- | --- | --- |
|  | 4 | 5 | 6 | 7 | 3 | 4 |
| Thin plate elastic modulus Room temperature | 27 GPa | 27 GPa | 23 GPa | 25 GPa | 10 GPa | 27 GPa |
| Thin plate elastic modulus High temperature | 20 Gpa | 21 GPa | 20 GPa | 20 GPa | 6 GPa | 21 GPa |
| Workability (Breakage rate) | 0% | 0% | 0% | 0% | 0% | 30% |

In comparison with Examples, Comparative Example 3 shows that the elastic modulus and strength were low as an inorganic compound was not a calcinated product, while Comparative Example 4 shows that as silica was added, the flexural modulus and strength were increased, but the drill workability was bad so that drills were broken.

INDUSTRIAL APPLICABILITY

Even when a wiring board is as thin as 0.2 mm or less, it is difficult to occur a problem of deteriorating the defect rate due to the board warpage and the board can be used for electronic board materials that are "light weight," "thin" and "downsizing".

What is claimed is:

1. A prepreg obtained by impregnating a substrate with a resin composition, wherein the resin composition comprises a resin component containing a maleimide group-containing compound, an epoxy resin, a phenolic resin containing at least one naphthalene ring, and a calcinated talc, wherein the calcinated talc is contained in an amount of not less than 30 weight parts and not more than 250 weight parts to 100 weight parts of the total amount of the resin component, and wherein the maleimide group-containing compound contains 2 or more maleimide groups, and is at least one selected from the group consisting of following compounds (1), (3) and (4);

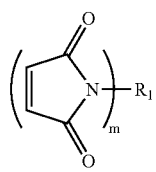
(1)

wherein in formula (1), $R_1$ represents an m-valent organic group and m is an integer of 2 to 10, and $R_1$ represents

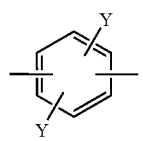
(2-1)

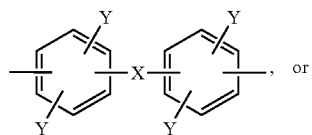
(2-2)

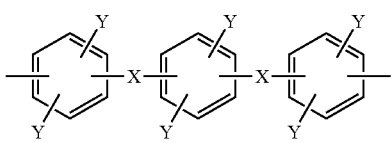
(2-3)

wherein in formulae (2-1), (2-2) and (2-3), X is the same or different with one another, and represents —$CH_2$—, —$C(CH_3)_2$—, —$C(C_2H_5)_2$—, —CO—, —O—, single bond, —S— or —$SO_2$—, and Y is the same or different with one another and represents —$CH_3$, —$CH_2CH_3$ or a hydrogen atom;

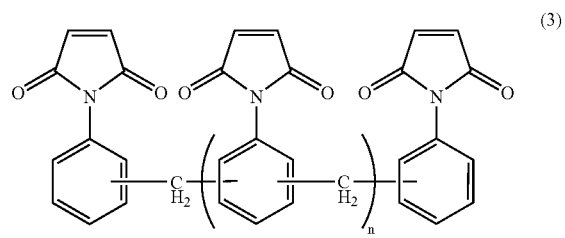
(3)

wherein in formula (3), n is 0 to 10 in average; and

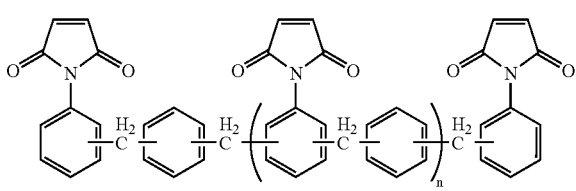
(4)

wherein in formula (4), n is 0 to 10 in average.

2. A laminate wherein a sheet of the prepreg according to claim 1 is heat-cured, or a plurality of sheets of the prepregs according to claim 1 are laminated and heat-cured.

3. The prepreg according to claim 1, wherein the epoxy resin is contained in an amount of not less than 10 weight % and not more than 50 weight % to the total weight of the resin composition.

4. The prepreg according to claim 1, wherein the phenolic resin is contained in an amount of not less than 10 weight % and not more than 50 weight % to the total weight of the resin composition.

5. A laminate comprising a resin obtained from a resin composition as an insulating layer, wherein the resin composition comprises a resin component containing a maleimide group-containing compound, an epoxy resin, a phenolic resin containing at least one naphthalene ring, and a calcinated talc, wherein the calcinated talc is contained in an amount of not less than 30 weight parts and not more than 250 weight parts to 100 weight parts of the total amount of the resin component, and wherein the maleimide group-containing compound contains 2 or more maleimide groups, and is at least one selected from the group consisting of following compounds (1), (3) and (4);

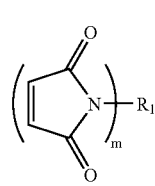
(1)

wherein in formula (1), $R_1$ represents an m-valent organic group and m is an integer of 2 to 10, and
$R_1$ represents

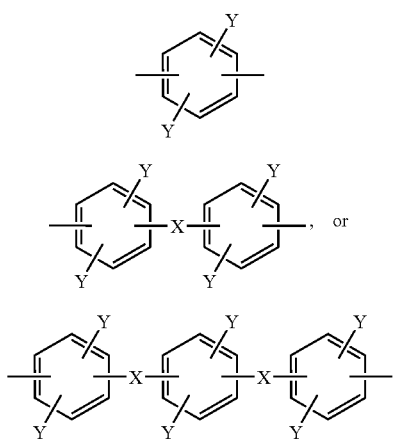
(2-1)
(2-2), or
(2-3)

wherein in formulae (2-1), (2-2) and (2-3), X is the same or different with one another, and represents —$CH_2$—, —$C(CH_3)_2$—, —$C(C_2H_5)_2$—, —CO—, —O—, single bond, —S— or —$SO_2$—, and Y is the same or different with one another and represents —$CH_3$, —$CH_2CH_3$ or a hydrogen atom;

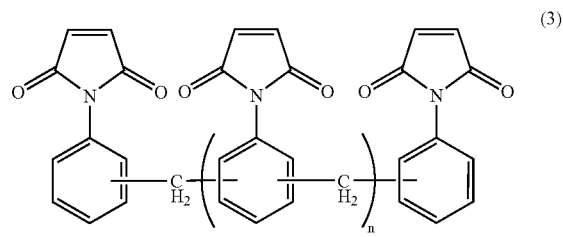
(3)

wherein in formula (3), n is 0 to 10 in average; and

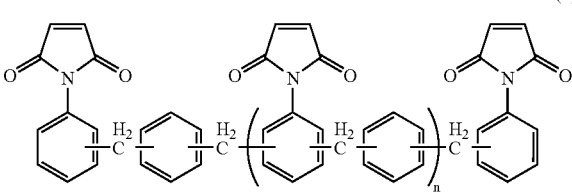
(4)

wherein in formula (4), n is 0 to 10 in average.

6. The prepreg according to claim 1, wherein the maleimide group-containing compound is contained in an amount of not less than 5 weight % and not more than 70 weight % to the total weight of the resin composition.

7. The laminate according to claim 5, wherein the epoxy resin is contained in an amount of not less than 10 weight % and not more than 50 weight % to the total weight of the resin composition.

8. The laminate according to claim 5, wherein the phenolic resin is contained in an amount of not less than 10 weight % and not more than 50 weight % to the total weight of the resin composition.

* * * * *